(12) United States Patent
Matsuo et al.

(10) Patent No.: US 11,862,553 B2
(45) Date of Patent: Jan. 2, 2024

(54) SEMICONDUCTOR DEVICE

(71) Applicant: Mitsubishi Electric Corporation, Tokyo (JP)

(72) Inventors: Hidetaka Matsuo, Tokyo (JP); Ryo Goto, Tokyo (JP); Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 46 days.

(21) Appl. No.: 17/454,888

(22) Filed: Nov. 15, 2021

(65) Prior Publication Data

US 2022/0262717 A1   Aug. 18, 2022

(30) Foreign Application Priority Data

Feb. 17, 2021 (JP) .................. 2021-023139

(51) Int. Cl.
*H01L 23/50* (2006.01)
*H01L 25/07* (2006.01)

(52) U.S. Cl.
CPC ............ *H01L 23/50* (2013.01); *H01L 25/072* (2013.01)

(58) Field of Classification Search
CPC ....... H01L 23/50; H01L 25/072; H01L 24/45; H01L 24/49; H01L 2224/32225; H01L 2224/45124; H01L 23/49811; H01L 2224/49111; H01L 2224/49175; H01L 2224/73265; H01L 23/49; H01L 23/4922; H05K 7/1457
See application file for complete search history.

(56) References Cited

U.S. PATENT DOCUMENTS

2011/0057713 A1* 3/2011 Kawanami ............. H01L 25/16
361/728
2017/0077044 A1   3/2017 Soyano

FOREIGN PATENT DOCUMENTS

WO   2016/084622 A1   6/2016

* cited by examiner

*Primary Examiner* — Elias Ullah
(74) *Attorney, Agent, or Firm* — Studebaker & Brackett PC

(57) ABSTRACT

An object is to provide a semiconductor device capable of reducing inductance between a high potential terminal and a low potential terminal while achieving downsizing of the semiconductor device. A semiconductor device includes: the insulating substrate; the circuit pattern including a low potential circuit pattern and a high potential circuit pattern provided on a region adjacent to the low potential circuit pattern; a plurality of semiconductor chips mounted on the circuit pattern; a low potential terminal having one end portion connected to the low potential circuit pattern; and a high potential terminal having one end portion connected to the high potential circuit pattern, wherein the high potential terminal and the low potential terminal include electrode parts and constituting parallel flat plates vertically disposed in parallel to each other and extending on a side of the low potential circuit pattern and electrode parts and protruding from the insulating substrate.

6 Claims, 5 Drawing Sheets

F I G. 2
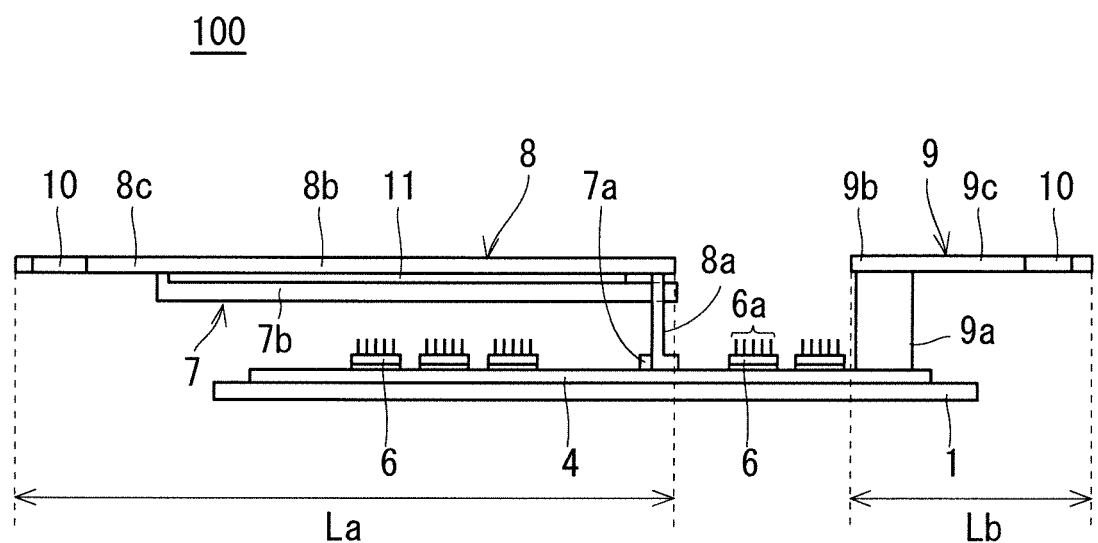

SEMICONDUCTOR DEVICE

BACKGROUND OF THE INVENTION

Field of the Invention

The present disclosure relates to a semiconductor device.

Description of the Background Art

There is conventionally a semiconductor device in which a plurality of semiconductor chips are mounted on an insulating substrate to constitute an electrical circuit. When the electrical circuit is made up using the plurality of semiconductor chips, the electrical circuit becomes complex and an area of a wiring region increases, thus there is a possibility that a size of a semiconductor device increases.

In order to solve such a problem, International Publication No. 2016/084622 proposes a technique of improving a circuit wiring in a semiconductor device having a complex electrical circuit, thereby downsizing the semiconductor device.

However, in the technique described in International Publication No. 2016/084622, a main terminal on a low potential side (corresponding to a low potential terminal) does not include a flat plate parallel to a main terminal on a high potential side (corresponding to a high potential terminal). Thus, there is a problem that inductance in a route from the main terminal on the high potential side to the main terminal on the low potential side increases.

SUMMARY

An object of the present disclosure is to provide a semiconductor device capable of reducing inductance between a high potential terminal and a low potential terminal while achieving downsizing of the semiconductor device.

A semiconductor device according to the present disclosure includes an insulating substrate, a circuit pattern, a plurality of semiconductor chips, a low potential terminal, and a high potential terminal. The circuit pattern includes a circuit pattern on a low potential side provided on the insulating substrate and a circuit pattern on a high potential side provided in a region adjacent to the circuit pattern on the low potential side on the insulating substrate. The plurality of semiconductor chips are mounted on the circuit pattern. The low potential terminal has one end portion connected to the circuit pattern on the low potential side. The high potential terminal has one end portion connected to the circuit pattern on the high potential side. The high potential terminal and the low potential terminal include a midway portion and the other end portion. The midway portion constitutes parallel flat plates vertical disposed in parallel to each other, and extends on a side of the circuit pattern on the low potential side. The other end portion protrudes from the insulating substrate.

The circuit pattern on the high potential side is formed in a position adjacent to the circuit pattern on the low potential side, thus when one end portion of the high potential terminal and one end portion of the low potential terminal are disposed in positions adjacent to each other, a length from one end portion of the high potential terminal to one end portion of the low potential terminal can be reduced, and a length of the parallel flat plate made up of the midway portion of each of the high potential terminal and the low potential terminal can be increased. This configuration can lead to increase in an area of the parallel flat plate.

As described above, the length from one end portion of the high potential terminal to one end portion of the low potential terminal is reduced and the area of the parallel flat plate is increased, thus inductance between the high potential terminal and the low potential terminal can be reduced in a semiconductor device while achieving downsizing of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a side view of the semiconductor device according to the embodiment 1.

DESCRIPTION OF THE PREFERRED EMBODIMENTS

Embodiment 1

Figure 1:
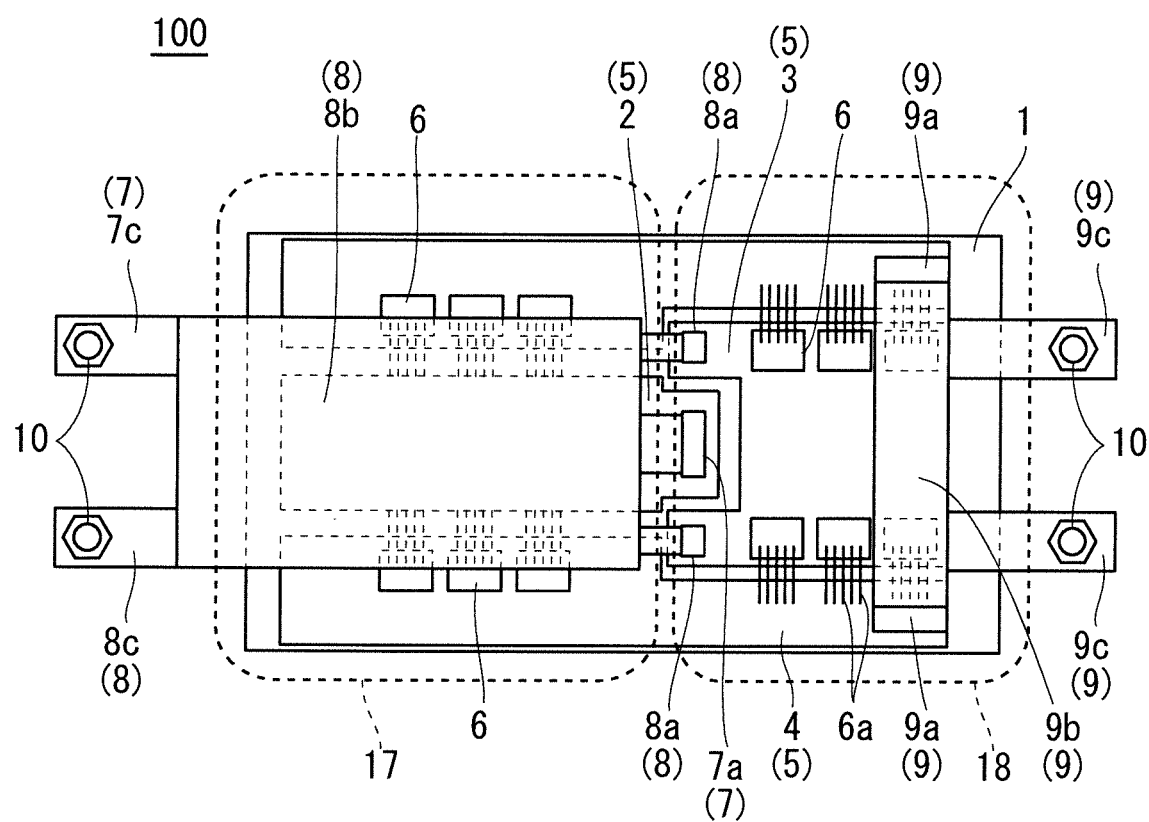
FIG. 1 is a top view of a semiconductor device according to an embodiment 1.

An embodiment 1 is described hereinafter using the drawings. FIG. 1 is a top view of a semiconductor device 100 according to the embodiment 1. FIG. 2 is a side view of the semiconductor device 100. In FIG. 1 and FIG. 2, an illustration of an insulating material as a sealing material is omitted to make an inner structure of the semiconductor device 100 visible.

As illustrated in FIG. 1, the semiconductor device 100 includes an insulating substrate 1, a circuit pattern 5, a plurality of (twelve, for example) semiconductor chips 6, a low potential terminal 7, a high potential terminal 8, and an output terminal 9. The semiconductor device 100 further includes an insulating material (illustration is omitted) such as gel sealing the insulating substrate 1, the circuit pattern 5, the plurality of semiconductor chips 6, a part of the low potential terminal 7, a part of the high potential terminal 8, and a part of the output terminal 9.

The insulating substrate 1 is made of ceramic, for example, and formed into a rectangular shape in a top view. The circuit pattern 5 is provided on an upper surface of the insulating substrate 1. The circuit pattern 5 includes a low potential circuit pattern 2 as the circuit pattern on the low potential side, a high potential circuit pattern 3 as the circuit pattern on the high potential side, and an output circuit pattern 4 as the circuit pattern on an output side.

The low potential circuit pattern 2 is provided in a range from a position closer to the other end of the upper surface of the insulating substrate 1 in a longitudinal direction in relation to a center portion thereof to one end portion thereof. The high potential circuit pattern 3 is provided in a region adjacent to the low potential circuit pattern 2. Specifically, the high potential circuit pattern 3 is provided in a range from a position closer to the other end of the upper surface of the insulating substrate 1 in the longitudinal direction in relation to the center portion thereof to the other end portion thereof.

Herein, the high potential circuit pattern 3 has a shape of surrounding an outer peripheral side of the low potential circuit pattern 2 so that the low potential circuit pattern 2 and the high potential circuit pattern 3 do not have contact with each other in the position closer to the other end of the upper surface of the insulating substrate 1 in the longitudinal direction in relation to the center portion thereof.

The output circuit pattern 4 is provided on an outer peripheral side of the low potential circuit pattern 2 and the high potential circuit pattern 3 on the upper surface of the insulating substrate 1. Specifically, the output circuit pattern 4 is provided along two sides of the upper surface of the insulating substrate 1 in the longitudinal direction.

As illustrated in FIG. 1, the plurality of semiconductor chips 6 are metal oxide semiconductor field effect transistors (MOSFET), for example, and mounted on the circuit pattern 5. Specifically, the twelve semiconductor chips 6 are SiC-MOSFETs. The six semiconductor chips 6 in the twelve semiconductor chips 6 are disposed to face each other to form three pairs on the high potential circuit pattern 3, and connected to a position located on a side of the high potential circuit pattern 3 in the output circuit pattern 4 using a plurality of aluminum wires 6a.

The remaining six semiconductor chips 6 are disposed to face each other to form three pairs in a position located on a side of the low potential circuit pattern 2 in the output circuit pattern 4, and connected to the low potential circuit pattern 2 using the plurality of aluminum wires 6a. The twelve semiconductor chips 6 are mounted in FIG. 1, however, the configuration is not limited thereto. It is sufficient that at least two semiconductor chips 6 are mounted.

Herein, "the side of the low potential circuit pattern 2" indicates a region 17 extending from the center portion of the upper surface of the insluting substrate 1 to one end portion in the longitudinal direction. "The side of the high potential circuit pattern 3" indicates a region 18 extending from the center portion of the upper surface of the insluting substrate 1 to the other end portion in the longitudinal direction.

As illustrated in FIG. 1 and FIG. 2, the low potential terminal 7 and the high potential terminal 8 constitute parallel flat plates vertically disposed via an insulating paper 11. The low potential terminal 7 includes a connection part 7a as one end portion connected to the low potential circuit pattern 2, a flat plate part 7b as a midway portion constituting the parallel flat plates with the high potential terminal 8, and an electrode part 7c as the other end portion protruding from the insulating substrate 1.

The flat plate part 7b is disposed in parallel to the insulating substrate 1 on an upper side of the insulating substrate 1. The flat plate part 7b extends to the side of the low potential circuit pattern 2 of the insulating substrate 1, and covers an upper surface of the low potential circuit pattern 2 and an upper surface of a part of the output circuit pattern 4.

The connection part 7a extends in an up-down direction, and one end portion thereof is connected to a position in the low potential circuit pattern 2 located on the side of the high potential circuit pattern 3, and the other end portion thereof is connected to one end portion of the flat plate part 7b.

The electrode part 7c has a width smaller than the flat plate part 7b in a top view, and is formed into an L-like shape in a side view. One end portion of the electrode part 7c is connected to the other end portion of the flat plate part 7b, and the electrode part 7c is bended to an upper side to extend to an outer side of the insulating substrate 1 in parallel to the flat plate part 7b. That is to say, the electrode part 7c protrudes from one end of the insulating substrate 1 in the longitudinal direction.

As illustrated in FIG. 1 and FIG. 2, the high potential terminal 8 includes a connection part 8a as one end portion connected to the high potential circuit pattern 3, a flat plate part 8b as a midway portion constituting the parallel flat plate with the low potential terminal 7, and an electrode part 8c as the other end portion protruding from the insulating substrate 1.

The flat plate part 8b is disposed in parallel to the insulating substrate 1 on the upper side of the insulating substrate 1, and located on an upper side of the flat plate part 7b of the low potential terminal 7. In other words, the flat plate part 7b of the low potential terminal 7 is disposed on a lower side of the flat plate part 8b of the high potential terminal 8. The flat plate part 8b extends to the side of the low potential circuit pattern 2 of the insulating substrate 1, and covers the upper surface of the low potential circuit pattern 2 and the upper surface of the part of the output circuit pattern 4.

The connection part 8a extends in the up-down direction, and one end portion thereof is connected to a position of the high potential circuit pattern 3 adjacent to the connection part 7a of the low potential terminal 7, and the other end portion thereof is connected to one end portion of the flat plate part 8b.

The electrode part 8c has a width smaller than the flat plate part 8b in a top view. One end portion of the electrode part 8c is connected to the other end portion of the flat plate part 8b, and the electrode part 8c extends to an outer side of the insulating substrate 1. That is to say, the electrode part 8c protrudes from one end of the insulating substrate 1 in the longitudinal direction. The electrode part 7c of the low potential terminal 7 and the electrode part 8c of the high potential terminal 8 are located in the same height position.

As illustrated in FIG. 1 and FIG. 2, the output terminal 9 is a terminal to which output of the semiconductor chip 6 is given, and includes two connection parts 9a as one end portions connected to a position in the output circuit pattern 4 located on the side of the high potential circuit pattern 3, a plate-like part 9b connecting the two connection parts 9a, and two electrode parts 9c as the other end portion protruding from the insulating substrate 1.

The two connection parts 9a extend in the up-down direction, and face each other with the high potential circuit pattern 3 therebetween. One end portion of the two connection parts 9a is connected to a position in the output circuit pattern 4 located on the side of the high potential circuit pattern 3. The plate-like part 9b is disposed in parallel to the insulating substrate 1 on the upper side of the insulating substrate 1.

The two electrode parts 9c are formed to have the same width as the plate-like part 9b, and formed in the same height position as the plate-like part 9b. The two electrode parts 9c protrude from the other end of the insulating substrate 1 in the longitudinal direction on a side opposite to a direction in which the electrode part 7c of the low potential terminal 7 and the electrode part 8c of the high potential terminal 8 protrude.

If the output terminal 9 is provided on the side of the low potential circuit pattern 2 of the output circuit pattern 4, that is to say, if the two connection parts 9a are connected to positions in the output circuit pattern 4 located on the side of the low potential circuit pattern 2 and the two electrode parts 9c protrude from one end of the insulating substrate 1 in the longitudinal direction, parasitic resistance between the semiconductor chip 6 disposed on the side of the high potential circuit pattern 3 and the output terminal 9 increases and an electrical loss of an electrical circuit made up of the plurality of semiconductor chips 6 increases.

If the two electrode parts 9c are connected to positions in the output circuit pattern 4 located on the side of the high potential circuit pattern 3 and the two electrode parts 9c protrude from one end of the insulating substrate 1 in the longitudinal direction, a length Lb from the connection part 9a to the electrode part 9c of the output terminal 9 (refer to FIG. 2) increases, thus inductance of the output terminal 9 increases.

In the embodiment 1, the output terminal 9 is provided on the side of the high potential circuit pattern 3 in the output circuit pattern 4 to solve such a problem. That is to say, the two connection parts 9a are connected to the positions in the output circuit pattern 4 on the side of the high potential circuit pattern 3, and the two connection parts 9c protrude from the other end of the insulating substrate 1 in the longitudinal direction.

Main electrode attaching parts 10 are provided in the electrode part 7c of the low potential terminal 7, the electrode part 8c of the high potential terminal 8, and the electrode part 9c of the output terminal 9.

Figure 3:
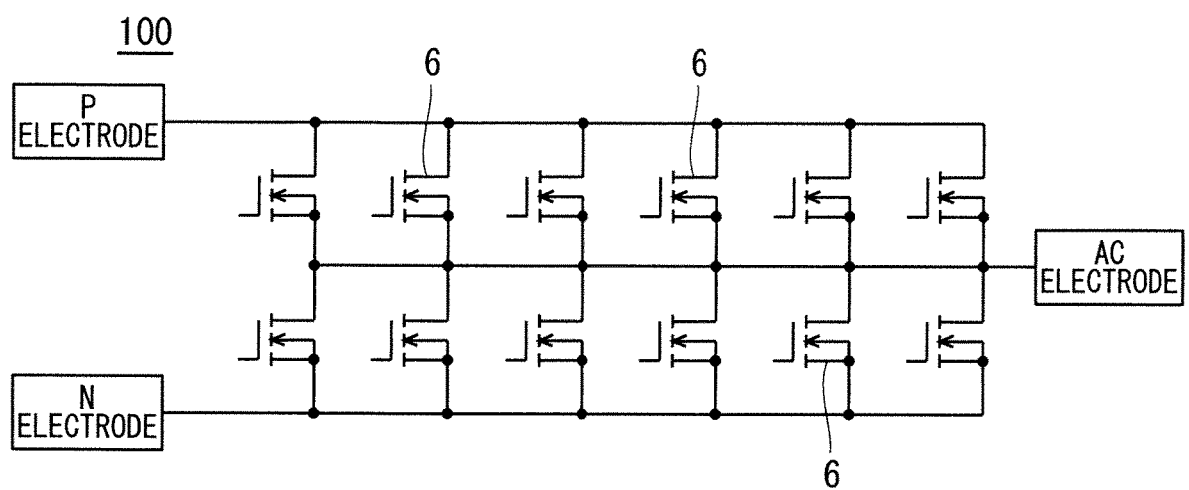
FIG. 3 is a circuit diagram illustrating an equivalent circuit of the semiconductor device according to the embodiment 1.

FIG. 3 is a circuit diagram illustrating an equivalent circuit of the semiconductor device 100. As illustrated in FIG. 3, in the semiconductor device 100, the six parallel semiconductor chips 6 are disposed on a side of an upper arm between a P electrode (corresponding to the high potential terminal 8) and an AC electrode (corresponding to the output terminal 9), and the six parallel semiconductor chips 6 are disposed on a side of a lower arm between an AC electrode (corresponding to the output terminal 9) and an N electrode (corresponding to the low potential terminal 7). Herein, a P electrode side and an N electrode side are referred to as the upper arm and the lower arm, respectively.

In the above description, the semiconductor chip 6 is the SiC-MOSFET, but is not limited thereto. The semiconductor chip 6 may be made up of a switching element such as reverse conductive insulated gate bipolar transistor (RC-IGBT) and a reflux element formed as one chip.

As described above, the semiconductor device 100 is sealed by an insulating material not shown in the drawings, and the electrode part 7c of the low potential terminal 7, the electrode part 8c of the high potential terminal 8, and the electrode part 9c of the output terminal 9 are exposed from the insulating material.

As described above, the semiconductor device 100 according to the embodiment 1 includes: the insulating substrate 1; the circuit pattern 5 including the low potential circuit pattern 2 provided on the insulating substrate 1 and the high potential circuit pattern 3 provided on the region adjacent to the low potential circuit pattern 2 on the insulating substrate 1; the plurality of semiconductor chips 6 mounted on the circuit pattern 5; the low potential terminal 7 having one end portion connected to the low potential circuit pattern 2; and the high potential terminal 8 having one end portion connected to the high potential circuit pattern 3, wherein the high potential terminal 8 and the low potential terminal 7 include the flat plate parts 8b and 7b constituting the parallel flat plates vertically disposed in parallel to each other and extending on the side of the low potential circuit pattern 2 and the electrode parts 8c and 7c protruding from the insulating substrate 1.

The high potential circuit pattern 3 is formed in the position adjacent to the low potential circuit pattern 2, thus when the connection part 8a of the high potential terminal 8 and the connection part 7a of the low potential terminal 7 are disposed in the positions adjacent to each other, the length from the connection part 8a of the high potential terminal 8 to the connection part 7a of the low potential terminal 7 can be reduced, and the length La of the parallel flat plate made up of each of the flat plate parts 8b and 7b of the high potential terminal 8 and the low potential terminal 7 (refer to FIG. 2) can be increased. This configuration can lead to increase in the area of the parallel flat plate.

As described above, the length from the connection part 8a of the high potential terminal 8 to the connection part 7a of the low potential terminal 7 is reduced and the area of the parallel flat plate is increased, thus inductance between the high potential terminal 8 and the low potential terminal 7 can be reduced in the semiconductor device 100 while achieving downsizing of the semiconductor device 100.

The six semiconductor chips 6 in the twelve semiconductor chips 6 are disposed to face each other to form three pairs on the high potential circuit pattern 3, and connected to the position located on the side of the high potential circuit pattern 3 in the output circuit pattern 4 using the plurality of aluminum wires 6a. The remaining six semiconductor chips 6 are disposed to face each other to form three pairs in the position located on the side of the low potential circuit pattern 2 in the output circuit pattern 4, and connected to the low potential circuit pattern 2 using the plurality of aluminum wires 6a.

The semiconductor chips 6 are disposed in this manner, thus a degree of freedom in arranging the aluminum wires 6a is increased. Accordingly, the number of aluminum wires 6a can be increased to reduce a current density for one aluminum wire 6a. Accordingly, inductance between the plurality of aluminum wires 6a can be reduced.

The semiconductor device 100 further includes the output terminal 9 to which output of the semiconductor chip 6 is given. The circuit pattern 5 further includes the output circuit pattern 4 provided on the outer peripheral side of the low potential circuit pattern 2 and the high potential circuit pattern 3 on the insulating substrate 1. The output terminal 9 includes the connection part 9a connected to the position in the output circuit pattern 4 located on the side of the high potential circuit pattern 3 and the electrode part 9c protruding from the insulating substrate 1.

Accordingly, the length Lb from the connection part 9a to the electrode part 9c of the output terminal 9 (refer to FIG. 2) can be reduced, thus parasitic resistance between the semiconductor chip 6 disposed on the side of the high potential circuit pattern 3 and the output terminal 9 can be reduced.

The semiconductor chip 6 is the SiC-MOSFET, thus high-speed interruption of current can be performed at a time of an off operation of the semiconductor chip 6. Accordingly, an electrical loss occurring at the time of interruption of the current can be reduced in the semiconductor chip 6.

The semiconductor chip 6 is made up of the switching element and the reflux element formed as one chip, thus density of the semiconductor device 100 can be increased, and the semiconductor device 100 can be further downsized.

The flat plate part 7b of the low potential terminal 7 is disposed on the lower side of the flat plate part 8b of the high potential terminal 8, thus the flat plate part 7b of the low potential terminal 7 constituting a lower part of the parallel flat plates and the low potential circuit pattern 2 and the aluminum wire 6a located on the lower side of the parallel flat plates have the same potential, and a height position of the parallel flat plates can be reduced. Accordingly, the semiconductor device 100 can be further downsized.

Embodiment 2

Figure 4:
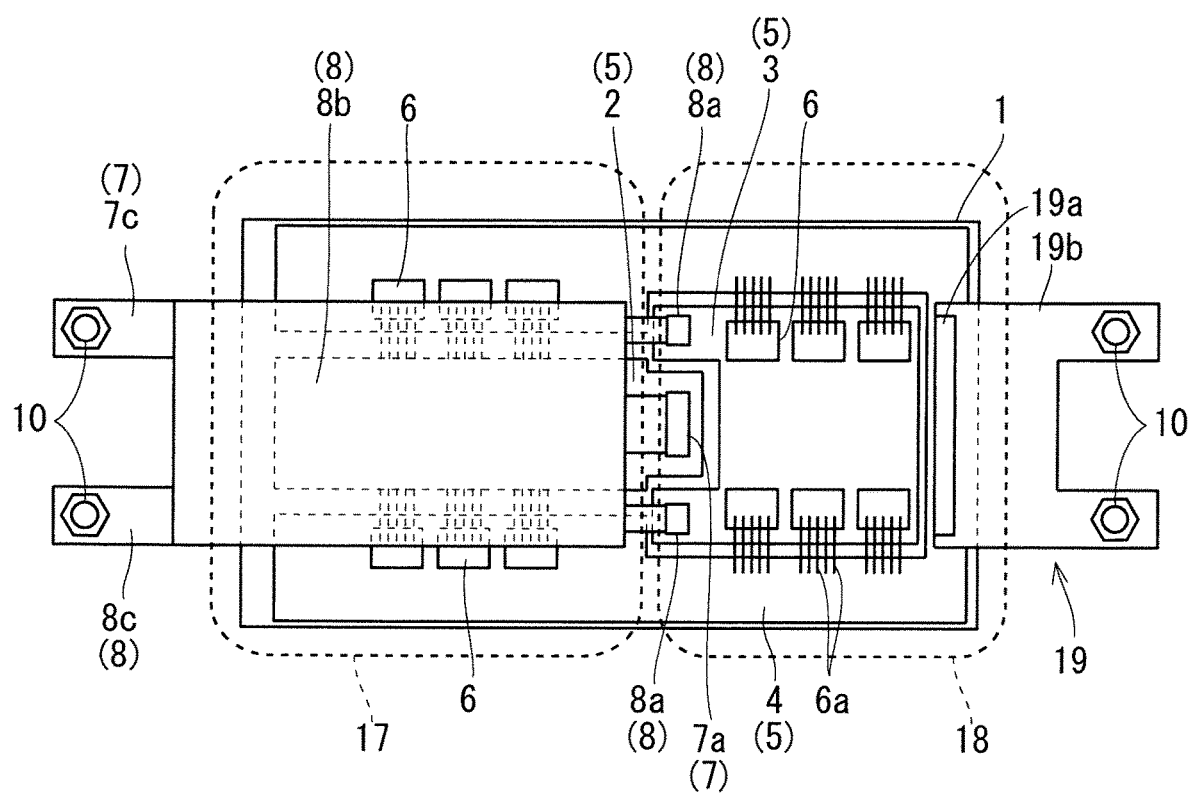
FIG. 4 is a top view of a semiconductor device according to an embodiment 2.
Figure 5:
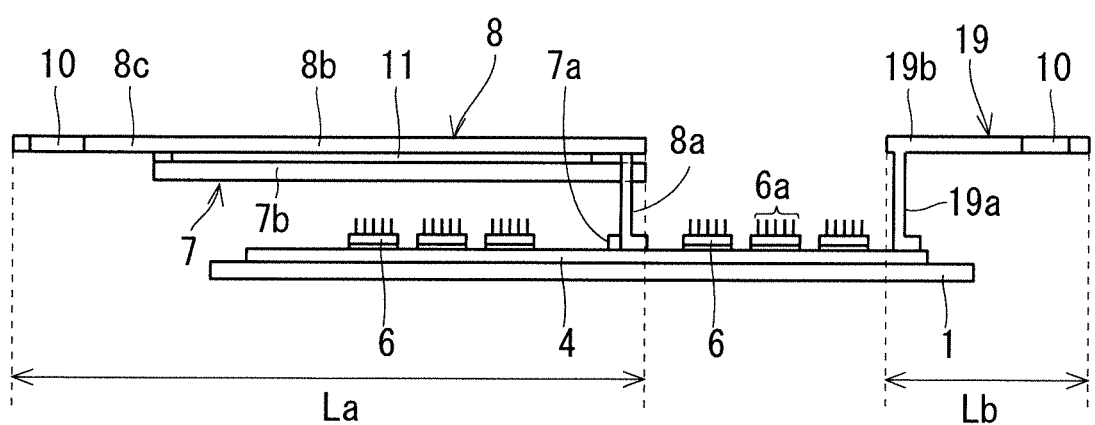
FIG. 5 is a side view of the semiconductor device according to the embodiment 2.

A semiconductor device 100A according to an embodiment 2 is described next. FIG. 4 is a top view of the semiconductor device 100A according to the embodiment 2. FIG. 5 is a side view of the semiconductor device 100A. In the description in the embodiment 2, the same reference numerals are assigned to the same constituent elements as those described in the embodiment 1, and the description thereof will be omitted.

As illustrated in FIG. 4 and FIG. 5, in the embodiment 2, a region where the output circuit pattern 4 is provided is different from that in the embodiment 1, and in accordance with this, the semiconductor device 100A includes, in place of the output terminal 9, an output terminal 19 having a shape and a position where the output terminal 19 is connected to the output circuit pattern 4 different from the output terminal 9.

The output circuit pattern 4 is provided along the two sides of the upper surface of the insulating substrate 1 in the longitudinal direction, and also provided in a side on the other end side of the upper surface of the insulating substrate 1 in the longitudinal direction.

The output terminal 19 includes a connection part 19a as one end portion connected to the side on the other end side in the output circuit pattern 4 in the longitudinal direction on the upper surface of the insulating substrate 1 and an electrode part 19b as the other end portion protruding from the insulating substrate 1.

The connection part 19a is provided along the side on the other end side on the upper surface of the insulating substrate 1 in the longitudinal direction, and extends in the up-down direction. One end portion of the connection part 19a is connected to a position in the output circuit pattern 4 located in the side on the other end side of the upper surface of the insulating substrate 1 in the longitudinal direction.

The electrode part 19b is formed into a U-like shape in a top view, and disposed in parallel to the insulating substrate 1 on the upper side of the insulating substrate 1. The electrode part 19b extends from the other end portion of the connection part 19a in a direction opposite to a direction in which the electrode part 7c of the low potential terminal 7 and the electrode part 8c of the high potential terminal 8 protrude. Two tip end portions having a U-like shape in the electrode part 19b protrude from the other end of the insulating substrate 1 in the longitudinal direction, and the main electrode attaching parts 10 are provided in the two tip end portion having the U-like shape in the electrode part 19b.

As described above, in the semiconductor device 100A according to the embodiment 2, the connection part 19a of the output terminal 19 is connected to the position located in the end portion on the insulating substrate 1 on the side opposite to the direction in which the electrode parts 8c and 7c of the high potential terminal 8 and the low potential terminal 7 protrude in the output circuit pattern 4.

Accordingly, the length Lb from the connection part 19a to the two tip end portions having the U-like shape of the electrode part 19b in the output terminal 19 can be reduced compared with the case in the embodiment 1.

The output circuit pattern 4 is provided in the side on the other end side of the upper surface of the insulating substrate 1 in the longitudinal direction, and the connection part 19a of the output terminal 19 is connected thereto. The high potential terminal 8 and the low potential terminal 7 are not disposed in the side on the other end side of the upper surface of the insulating substrate 1 in the longitudinal direction, thus an area of the position where the output terminal 19 is connected to the output circuit pattern 4 can be increased. Accordingly, contact resistance in the position where the output terminal 19 is connected to the output circuit pattern 4 can be reduced.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device, comprising:
an insulating substrate;
a circuit pattern including a circuit pattern on a low potential side provided on the insulating substrate and a circuit pattern on a high potential side provided in a region adjacent to the circuit pattern on the low potential side on the insulating substrate;
a plurality of semiconductor chips mounted on the circuit pattern;
a low potential terminal having one end portion connected to the circuit pattern on the low potential side; and
a high potential terminal having one end portion connected to the circuit pattern on the high potential side, wherein
the insulating substrate is a single insulating substrate, and
the high potential terminal and the low potential terminal include a midway portion constituting parallel flat plates vertical disposed in parallel to each other and extending on a side of the circuit pattern on the low potential side and another end portion protruding from the insulating substrate.

2. The semiconductor device according to claim 1, further comprising
an output terminal to which output of the semiconductor chips is given, wherein
the circuit pattern further includes a circuit pattern on an output side provided on an outer peripheral side of the circuit pattern on the low potential side and the circuit pattern on the high potential side on the insulating substrate, and
the output terminal includes one end portion connected to a position in the circuit pattern on the output side located on a side of the circuit pattern on the high potential side and another end portion protruding from the insulating substrate.

3. The semiconductor device according to claim 2, wherein
the one end portion of the output terminal is connected to a position located in an end portion on the insulating substrate on a side opposite to a direction in which the another end portion of the high potential terminal and the another end portion of the low potential terminal protrude in the circuit pattern on the output side.

4. The semiconductor device according to claim 1, wherein
each of the semiconductor chips is made up of a switching element and a reflux element formed as one chip.

5. The semiconductor device according to claim 1, wherein the midway portion of the low potential terminal is disposed on a lower side of the midway portion of the high potential terminal.

6. The semiconductor device according to claim 1, wherein
each of the semiconductor chips is an SiC-MOSFET.

\* \* \* \* \*